US006977433B2

(12) United States Patent
Rugg

(10) Patent No.: US 6,977,433 B2
(45) Date of Patent: Dec. 20, 2005

(54) MULTI FUNCTION PACKAGE

(75) Inventor: William Leon Rugg, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 2 days.

(21) Appl. No.: 10/695,192

(22) Filed: Oct. 28, 2003

(65) Prior Publication Data

US 2005/0087882 A1 Apr. 28, 2005

(51) Int. Cl.[7] .............................................. H01L 23/34
(52) U.S. Cl. ................. 257/723; 257/777; 257/787; 257/734; 257/773; 438/106; 438/107; 438/127
(58) Field of Search ................. 257/723, 777, 257/787, 734, 773; 438/106, 107, 127

(56) References Cited

U.S. PATENT DOCUMENTS

| | | | |
|---|---|---|---|
| 6,531,773 B2 | 3/2003 | Nishizawa et al. | |
| 6,602,735 B2 | 8/2003 | Shyu | |
| 6,604,231 B2 | 8/2003 | Kaneko | |
| 6,611,012 B2 * | 8/2003 | Miyamoto et al. | 257/286 |
| 6,617,700 B2 | 9/2003 | Lee et al. | |
| 6,620,648 B2 | 9/2003 | Yang | |
| 6,630,744 B2 | 10/2003 | Tsuda | |
| 6,812,726 B1 * | 11/2004 | Ong | 324/765 |

\* cited by examiner

Primary Examiner—Jasmine Clark
(74) Attorney, Agent, or Firm—David K. Lucente; Derek J. Berger

(57) ABSTRACT

A multi-chip package for a computer disc drive. In a preferred embodiment, the multi-chip package (MCP) includes a first die having a buffer function thereon, such as an SDRAM device, and a second die including a channel function and a controller function thereon. The two die are packaged in a single package for placement on a printed circuit board of the disc drive.

15 Claims, 4 Drawing Sheets

MULTI FUNCTION PACKAGE

FIELD OF THE INVENTION

The present invention relates generally to semiconductor fabrication and packaging. More particularly, the present invention relates to multi-chip packaging of drive functions.

BACKGROUND OF THE INVENTION

Computers use disc drives for storing information. Disk drives typically include a magnetic disc that rotates while one or more heads read and write information from and to the disc. Functions of a disc drive usually include a controller for interfacing the drive with the rest of the computer system; a channel function that communicates with the controller, and manages read and write functions of the disc; and a buffer function that acts as a cache for the disc drive, such as an SDRAM (Synchronous Dynamic Random Access Memory). Such devices are typically fabricated using semiconductor processing technology to create integrated circuits having the necessary components to perform the necessary functions.

Traditionally, these disc drive functions are provided in computer systems using multiple packages per disc drive function. For example, buffer functions provided by SDRAM devices are usually provided on one die while controller and channel functions are provided for on a separate die. In current computer systems, these two dies are packaged separately and placed separately on a printed circuit board (PCB).

There are several problems associated with mounting individual chips on a PCB. A chip package is several times the area of the die itself, taking up more space on the circuit board. Circuit resistance is increased by the individual resistances of all the package pins and the electrical path lengths are multiplied by the number of chips and package leads. In current designs, the length traveled by the point-to-point signals and the number of interconnects required between these separate packages have enormous performance and system level implications, such as increased noise, and an increase in required signal strength due to the number of interconnects separating the relevant devices.

Another issue involves the reliability of the ICs (Integrated Circuits) placed on a PCB. In individual package processes, a final test assures the quality of the completed product. If the chip is bad or the process faulty, the entire chip and package is discarded. But when packaging devices together, failure of one of the packaged dies means both must be discarded, adding to waste and increasing the overall cost because of lost good components shared in the package with bad components and the need to increase testing to prevent such loss.

One option is to rely on the results of a wafer-sort test to certify die performance. Unfortunately, wafer sort does not include environmental tests or long term reliability tests. Therefore, there is a need in the art for a reliable alternative to the multi-package solution for disc drive functions.

The present invention provides a solution to this and other problems, and offers other advantages over previous solutions.

SUMMARY OF THE INVENTION

The present invention relates to multi-chip packages (MCPs) that have combined disc drive functions in one package which solve the above-mentioned problems.

In accordance with an embodiment of the present invention, a method is provided in which a memory die is packaged with a channel and controller die, combining functions in a single package. Combining the die in a single package reduces the number of interconnects required, which improves performance and allows the innovative system to support today's performance requirements. The innovative MCP allows a disc drive to have two die with three functions in one package on a standard industry disc drive. This allows removal of many signal interconnects from the system and improves performance, reduces noise, and lowers package and raw board costs.

These and various other features as well as advantages which characterize the present invention will be apparent upon reading of the following detailed description and review of the associated drawings.

DETAILED DESCRIPTION

Figure 1:
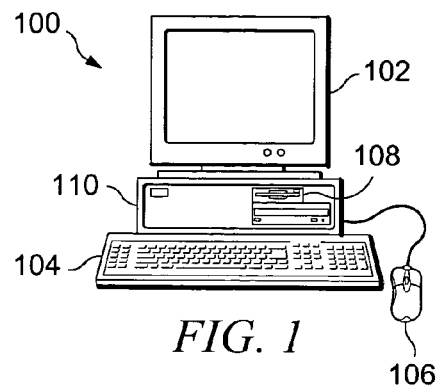
FIG. 1 is a diagram of a computer system consistent with implementation of a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
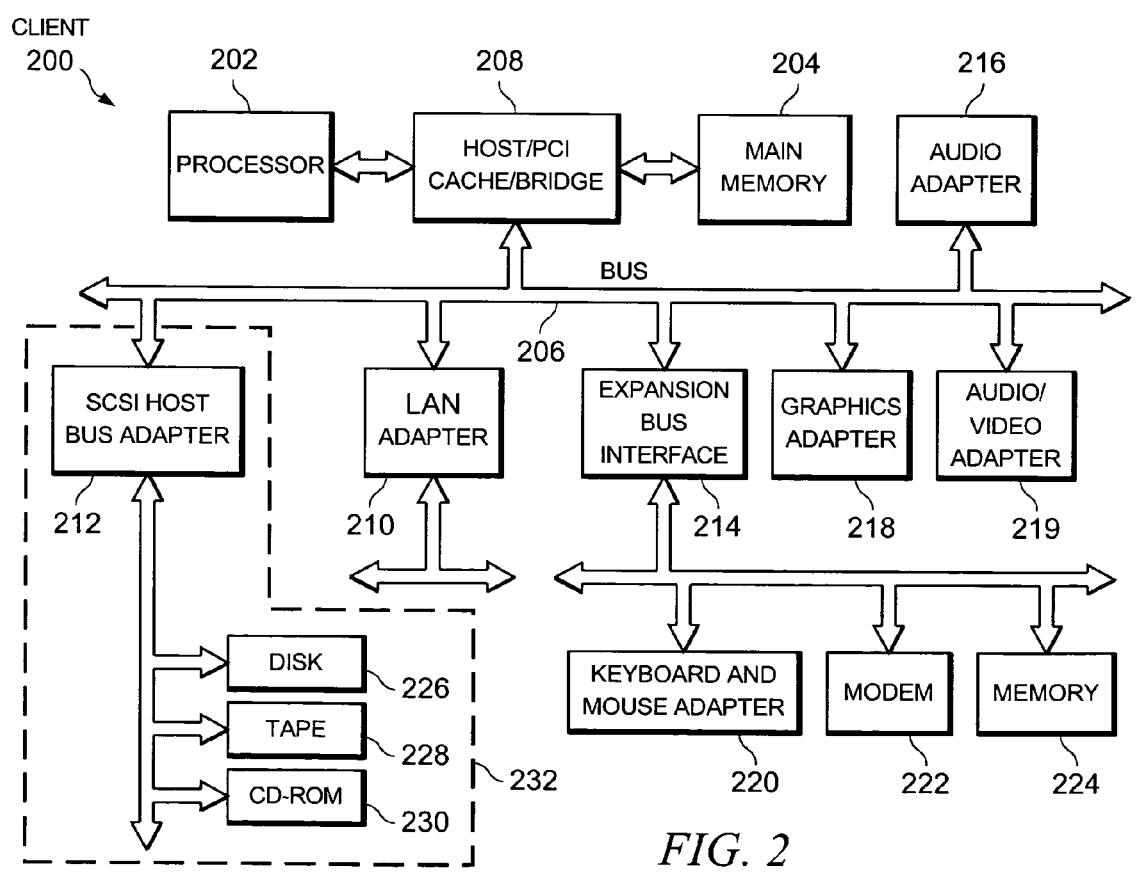
FIG. 2 shows a block diagram of functional parts of the computer system of FIG. 1.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

Figure 3:
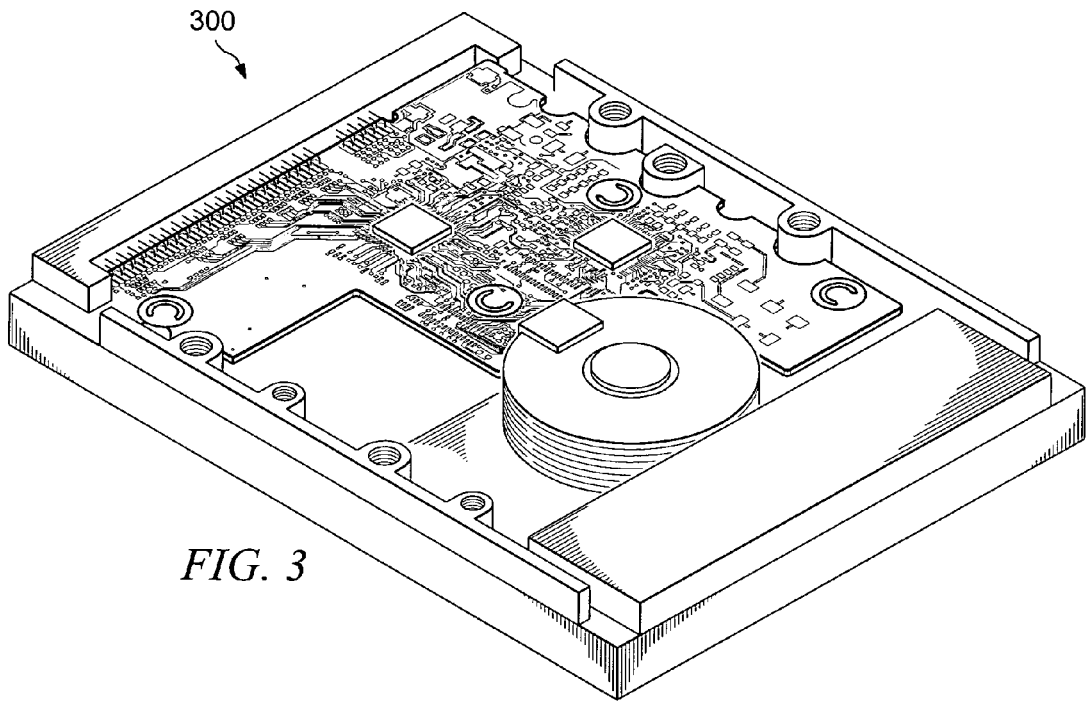
FIG. 3 shows a hard disc drive system consistent with implementation of a preferred embodiment of the present invention.

Referring now to FIG. 3, a general hard disc drive system is shown, consistent with implementation of a preferred embodiment of the present invention. This example shows hard disc drive 300 in the form of a standard 95 mm HDD with BGA (ball grid array) MCP (multi-chip package) 300. It is in this context that the present invention is preferably incorporated. Hard disc drive 300 is implemented, for example, as disc 226 in the above described computer system, but can serve different functions, such as storage in other types of information processing systems, such as a server.

Standard industry disc drive electronics are configured with individual packages for the controller/channel and buffer functions on a printed circuit board (PCB). For example, controlling the read and write functions of a disc usually includes control of operation of a motor that controls movement of a read/write head. The length of the point-to-point signal and number of interconnects between these functions have measurable performance and system level noise implications. Because of reliability issues, standard disc drive electronics do not package die for the buffer (for example, SDRAM) functions with the die for the controller and channel functions. However, by using a known good die (KGD) chip for the buffer or memory function, the buffer function die can be reliably packaged with the channel and controller die, combining all these functions into a single package. Known good die chips undergo environmental testing at wafer probe, and includes laser repair of bad cells, followed by retesting as necessary. This process greatly increases the reliability of the KGD chip. The innovative multi-chip package (MCP) allows a disc drive to have two die with three functions in one package. This MCP allows removal of many signal interconnects, improving performance, reducing noise, and lowering package and raw board costs.

Figure 4:
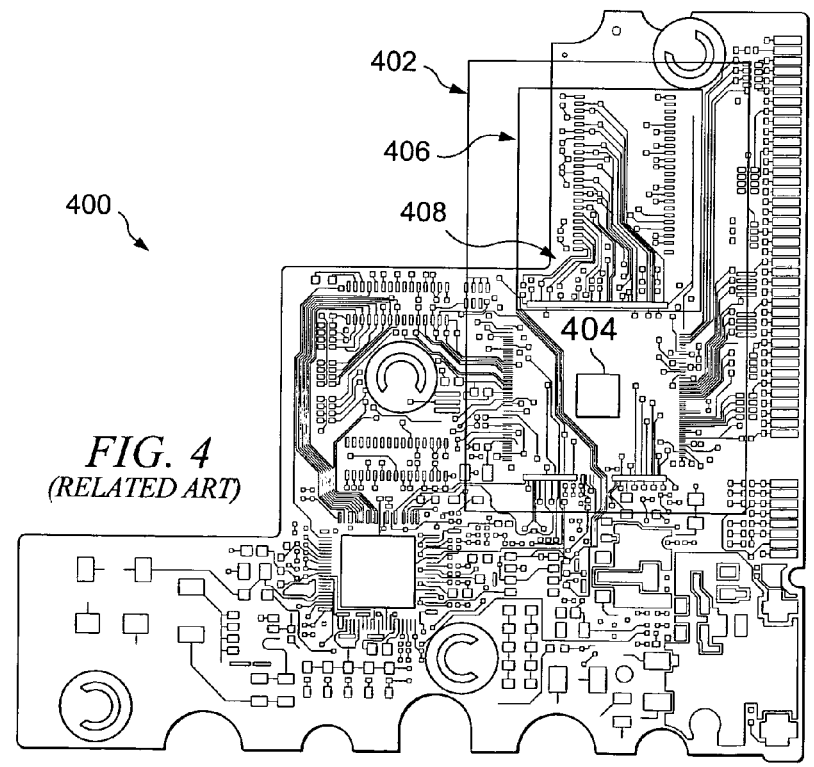
FIG. 4 shows a printed circuit board.

Referring now to FIG. 4, a printed circuit board (PCB) 400 having multiple packages for use in a hard disc drive is shown. Region 402 identifies the area of PCB 400 where the die for the controller/channel functions and the die for the buffer function are placed. Area 404 shows the placement of the die for the controller/channel functions. It is noted that interconnects 408 are positioned between area 404 and area 406 to allow communication between the buffer function and the controller/channel functions. These interconnects introduce significant performance degradation.

Figure 5:
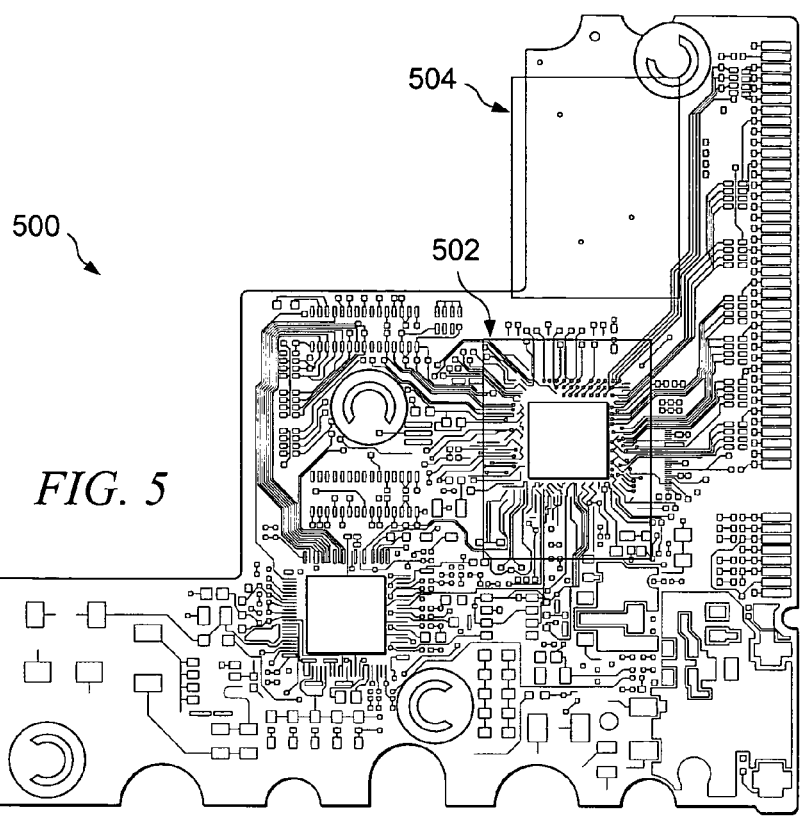
FIG. 5 shows a printed circuit board having a single multi-chip package, consistent with a preferred embodiment of the present invention.

FIG. 5 shows an innovative PCB 500 consistent with implementation in a preferred embodiment of the present invention. PCB 500 may be used in hard disc drive 300 in FIG. 3. Area 502 shows the location for a MCP that combines the functions of the buffer, and the channel and controller functions. Area 504 shows the space savings achieved by combining the two die in one package for placement on PCB 500. Not only is space 504 saved, but the number of interconnects between the two die is reduced, improving performance and reducing noise.

Figure 6:
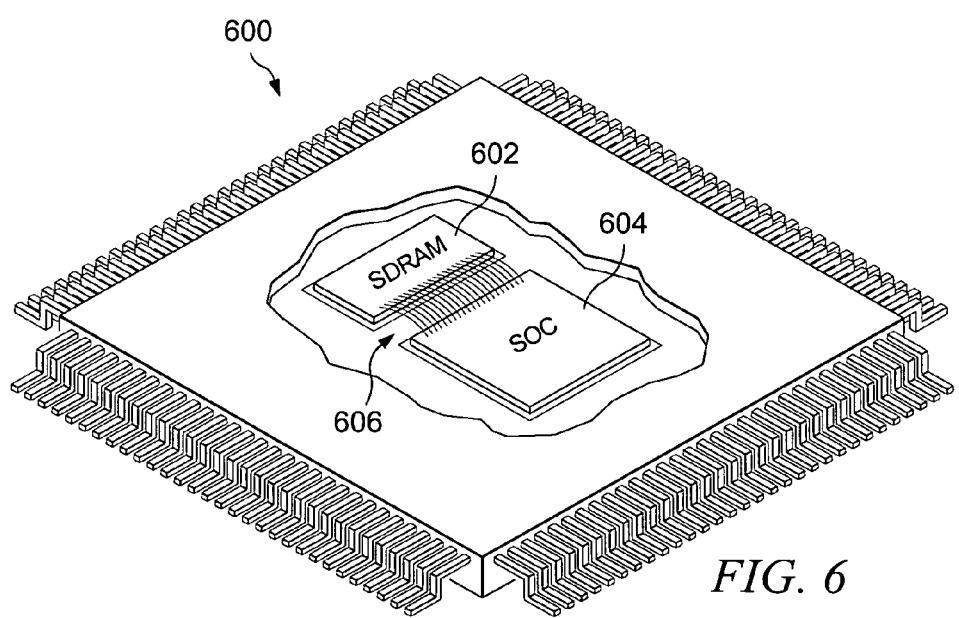
FIG. 6 shows a cutaway view of an innovative package according to a preferred embodiment of the present invention.

FIG. 6 shows a cutaway view of an innovative package according to a preferred embodiment of the present invention. Though the buffer, controller, and channel functions may be integrated into a single monolithic die, such a solution suffers from difficulty in testing, and costly reproduction of the entire die (with all three functions thereon) when one of the functions fails to work properly. Monolithic die with these functions are also proportionately more expensive to produce.

In FIG. 6, the integrated circuit package 600 is a dual e-pad TQFP (Thin Quad Flat Pack) package 176 in this illustrative example. Other types of packaging are also consistent with the present invention, such as a ball grid array (BGA) that attaches to the PCB using a series of solder bumps. In the example of FIG. 6, the SDRAM die 602 is shown next to the SOC (system on chip 604—which includes the controller and channel functions). Interconnects 606 are used to connect the SDRAM die 602 with the SOC die 604. Such integrated interconnects within a single package are shorter than the required interconnects between separately packaged die, which must be placed at different locations on a PCB.

Figure 7:
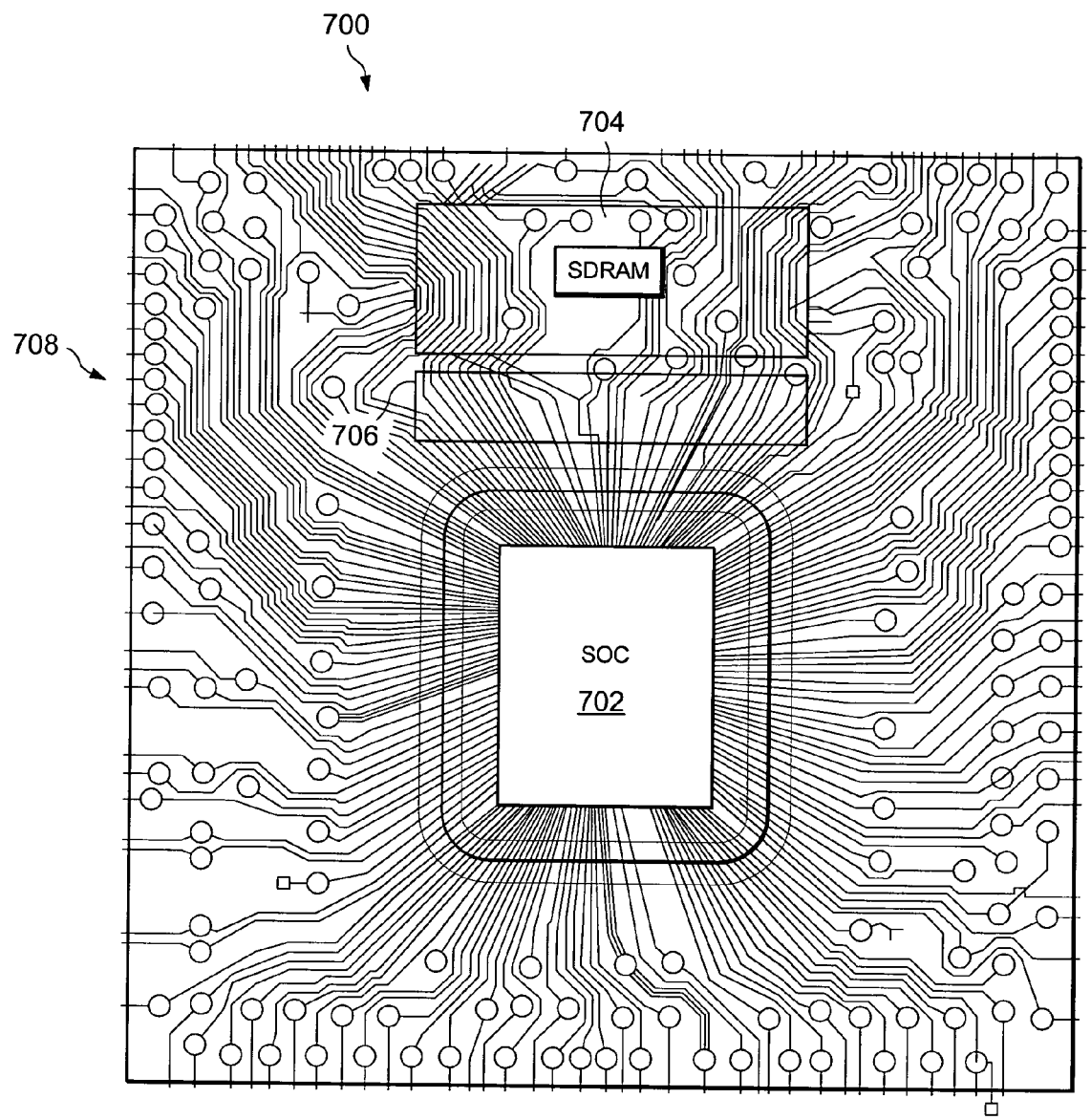
FIG. 7 shows the innovative multi-chip package according to a preferred embodiment of the present invention.

FIG. 7 shows an innovative MCP according to a preferred embodiment of the present invention. MCP 700 includes two dies, SOC 702 and SDRAM 704. Interconnects, such as example interconnects 706, connect relevant locations on each die, SOC 702 and SDRAM 704, to one another and to the pins 708 on the PCB on which MCP 700 is placed.

Thus, the present invention provides a multi-chip package for a disc drive that eliminates interconnects, increases space, and improves performance by reducing noise and required signal strength between the buffer function die and the controller/channel die.

The specific examples given herein are not intended to limit the scope of the present invention, which is determined by the claims. The examples presented are intended to teach preferred embodiments of the innovative ideas hereby presented.

What is claimed is:

1. An apparatus comprising:
    a first die having channel and controller functions; and
    a second die having a buffer function, wherein the first and second dies are packaged together in a single package and pins of the single package connect to the first die and the second die.

2. The apparatus of claim 1, wherein the second die comprises a synchronous dynamic random access memory in a known good die format.

3. The apparatus of claim 1, wherein the single package is a thin quad flat pack package.

4. The apparatus of claim 1, wherein the single package is a ball grid array package.

5. A computer system, comprising:
    a disc drive;
    a first die having a buffer function;
    a second die having a controller and channel function;
    wherein the first die is connected to the second die and wherein the first die and second die are packaged in a single package.

6. The system of claim 5, wherein the buffer function comprises a synchronous dynamic random access memory in a known good die format.

7. The system of claim 5, wherein the single package is a thin quad flat pack package.

8. The system of claim 5, wherein the single package is a ball grid array package.

9. The system of claim 5, wherein the single package is placed on a printed circuit board of the disc drive.

10. The system of claim 5, wherein the first die and the second die are connected by interconnects.

11. A method of making a disc drive for a computer system, comprising the steps of:
    attaching a first die to a first area of a package;
    attaching a second die to a second area of the package;
    connecting the first die and second die with interconnects;
    wherein the first die includes a buffer function for the disc drive; and
    wherein the second die includes a controller function and a channel function for the disc drive.

12. The method of claim 11, wherein the buffer function comprises a synchronous dynamic random access memory in a known good die format.

13. The method of claim 11, wherein the package is a thin quad flat pack package.

14. The method of claim 11, wherein the package is a ball grid array package.

15. The method of claim 11, wherein the package is placed on a printed circuit board of the disc drive.

* * * * *